US006995589B2

United States Patent
Chen et al.

(10) Patent No.: US 6,995,589 B2
(45) Date of Patent: Feb. 7, 2006

(54) FREQUENCY DIVIDER FOR RF TRANSCEIVER

(75) Inventors: Chun-Chieh Chen, Hsin-Tien (TW); Jyh-Fong Lin, Hsin-Tien (TW)

(73) Assignee: Via Technologies Inc., Hsin-Tien (TW)

( * ) Notice: Subject to any disclaimer, the term of this patent is extended or adjusted under 35 U.S.C. 154(b) by 45 days.

(21) Appl. No.: 10/460,241

(22) Filed: Jun. 13, 2003

(65) Prior Publication Data

US 2004/0251935 A1 Dec. 16, 2004

(51) Int. Cl.
*H03K 21/00* (2006.01)

(52) U.S. Cl. .......................... 327/117; 377/111; 377/108
(58) Field of Classification Search ................. 327/113, 327/115, 117, 122; 377/118, 119, 122, 48, 377/108
See application file for complete search history.

(56) References Cited

U.S. PATENT DOCUMENTS

| | | | | |
|---|---|---|---|---|
| 3,906,374 A | * | 9/1975 | Fletcher et al. | 377/111 |
| 4,516,251 A | * | 5/1985 | Gallup | 377/110 |
| 5,426,682 A | | 6/1995 | Takatsu | |
| 5,524,037 A | * | 6/1996 | Donig et al. | 377/108 |
| 2003/0090303 A1 | | 5/2003 | Kimura et al. | |

FOREIGN PATENT DOCUMENTS

| | | |
|---|---|---|
| EP | 0488034 A2 | 6/1992 |
| EP | 0488034 A3 | 6/1992 |
| JP | 1981129431 A | 10/1981 |
| JP | 0114879 * | 5/1994 |

OTHER PUBLICATIONS

Magoo et al.;"RF Local Oscillator Path for GSM Direct Conversion Transceiver with True 50% Duty Cycle Divide by Three and Active Third Harmonic Cancellation";Conexant Systems Inc., Newport Beach, CA92604,USA;2002 IEEE Radio Frequency Integrated Circuits Symposium; ISBN 0780372468.

* cited by examiner

*Primary Examiner*—Dinh T. Le
(74) *Attorney, Agent, or Firm*—Winston Hsu

(57) ABSTRACT

A frequency divider for dividing a frequency of a clock signal by an odd divisor includes a flip-flop chain for latching signals having a number of flip-flops equal to the divisor. The frequency divider also has an XOR gate having two input nodes and an output node, one input node being electrically connected to the clock signal, the other input node being electrically connected to an inverted output node of the last flip-flop, and the output node of the XOR gate being electrically connected to clock input nodes of the odd flip-flops in the flip-flop chain. The frequency divider further has an inverter, an input node of the inverter being electrically connected to the output node of the XOR gate, an output node of the inverter being electrically connected to clock input nodes of the even flip-flops in the flip-flop chain.

17 Claims, 9 Drawing Sheets

FREQUENCY DIVIDER FOR RF TRANSCEIVER

CROSS REFERENCE TO RELATED APPLICATIONS

BACKGROUND OF INVENTION

1. Field of the Invention

The present invention relates to a frequency divider, and more particularly, to a frequency divider for RF transceivers, which utilizes general-purpose flip-flops.

2. Description of the Prior Art

A local oscillator (LO) path in a communication system provides the mixing tone to up convert low frequency modulated signals in a transmitter, and to down convert received signals so that they may be demodulated. Currently, as die sizes of integrated circuits are getting smaller, on-channel LO frequencies interacting with and corrupt received and transmitted radio frequency (RF) signals has become a serious problem.

In direct conversion receivers, wherein direct conversion implies that in the receiver the LO frequency is equal to the received RF frequency, interactions between the LO signal and the RF signal due to coupling through the substrate of the chip can lead to DC offsets, which corrupt data in modulation schemes such as EDGE or GSM containing information at DC.

One way to avoid this phenomenon is to divide the LO frequency by three and then to double or quadruple it. This guarantees that neither the LO nor any of its harmonics correspond to the received RF frequency.

R. Magoon and A. Molnar in "RF Local Oscillator Path for GSM Direct Conversion Transceiver with True 50% Duty Cycle Divide by Three and Active Third Harmonic Cancellation, page 23~26, 2002 IEEE Radio Frequency Integrated Circuit Symposium" disclosed such an RF local oscillator path. Please refer to FIG. 1. FIG. 1 shows a diagram of an LO path 10 using a UHF (Ultra-High Frequency) VCO (Voltage-Controlled Oscillator) with $f_c$=1350 MHz according to the prior art. The LO path 10 comprises a VCO 12 for generating an oscillating signal with a central frequency $f_c$=1350 MHz; a divide-by-three frequency divider 14 electrically connected to the VCO 12, for dividing the frequency of the oscillating signal by three to generate a 450 MHz signal; a first frequency doubler 16 electrically connected to the frequency divider 14, for multiplying the frequency of the signal generated by the frequency divider 14 by two to generate a 900 MHz signal, which can be used as an LO signal in a GSM system; and a second frequency doubler 18 electrically connected to the first frequency doubler 16, for multiplying the frequency of the signal generated by the first frequency doubler 16 by two to generate a 1800 MHz signal, which can be used as an LO signal in a DCS or a PCS system.

Now please refer to FIG. 2. FIG. 2 shows a divide-by-three frequency divider 20 according to prior art. In the prior art LO path 10 shown in FIG. 1, the frequency divider 20 in FIG. 2 is used as the frequency divider 14. The frequency divider 20 comprises a first, a second, and a third phase switchable D flip-flops 22, 24, 26. Each phase switchable D flip-flop has a data input node D, a clock input node clk, a first output node Q, and a second output node Qbar for outputting a logic signal complementary to a logic signal outputted at the first output node Q, as an ordinary general-purpose D flip-flop does. In addition to those, each phase switchable D flip-flop in FIG. 2 further has a phase-switching input node θ. By dynamically driving the phase-switching input node θ of the flip-flop, a signal at the first output node Q can be made to transition on either a rising edge or a falling edge of a signal inputted at the clock input node clk.

Please refer to FIG. 3. FIG. 3 shows a circuit diagram of a phase switchable D flip-flop according to prior art, used as phase switchable D flip-flops 22, 24, 26 in FIG. 2. The phase switchable D flip-flop in FIG. 3 is composed of a plurality of ECL (Emitter Coupled Logic) transistors and a plurality of resistors. All the signals are inputted and outputted differentially.

In FIG. 2, the data input node D1 of the first flip-flop 22 is electrically connected to the second output node Qbar3 of the third flip-flop 26, and the phase-switching input node θ1 of the first flip-flop 22 is electrically connected to the first output node Q2 of the second flip-flop 24. The data input node D2 of the second flip-flop 24 is electrically connected to the first output node Q1 of the first flip-flop 22, and the phase-switching input node θ2 of the second flip-flop 24 is electrically connected to the second output node Qbar3 of the third flip-flop 26. The data input node D3 of the third flip-flop 26 is electrically connected to the first output node Q2 of the second flip-flop 24, and the phase-switching input node θ3 of the third flip-flop 26 is electrically connected to the second output node Qbar1 of the first flip-flop 22. Finally, all the clock input nodes clk1, clk2, clk3 of the first, the second, and the third flip-flops 22, 24, 26 are electrically connected to an input signal in, which is the signal with the central frequency $f_c$=1350 MHz generated by the VCO 12 in FIG. 1.

Now please refer to FIG. 4. FIG. 4 shows a time sequence of signals at the nodes shown in FIG. 2. Under the configuration in FIG. 2, signals at the first output nodes Q1, Q2, Q3 of the flip-flops 22, 24, 26 have frequencies one-third a frequency of the input signal in at the clock input nodes clk1, clk2, clk3, wherein the signal at the first output node Q1 leads the signal at the first output node Q2 by a 60° phase difference, and the signal at the first output node Q2 leads the signal at the first output node Q3 by a 60° phase difference.

The divide-by-three frequency divider in FIG. 2 utilizing the phase-switching D flip-flop in FIG. 3 serves the purpose of the LO path in FIG. 1 well. However, since the phase-switching D flip-flop in FIG. 3 is far more complex than a general-purpose flip-flop and requires more circuitry to implement, and a consequently larger chip area, an LO path with such a frequency divider tends to have increased costs of manufacture.

SUMMARY OF INVENTION

It is therefore a primary objective of the claimed invention to provide a divide-by-N frequency divider utilizing general-purpose flip-flops, to solve the above-mentioned problem.

According to the claimed invention, a frequency divider for dividing a frequency of a clock signal by a divisor, the divisor being an odd number, comprises a flip-flop chain having a plurality of flip-flops for latching signals, an amount of flip-flops being equal to the divisor, each flip-flop having a data input node, a clock input node, a first output node, and a second output node for outputting a logic signal complementary to a logic signal outputted at the first output node, the first output node of each but the last flip-flop being electrically connected to the data input node of the next flip-flop, the second output node of the last flip-flop being electrically connected to the data input node of the first flip-flop; an XOR gate having two input nodes and an output node, one input node of the XOR gate being electrically connected to the clock signal, the other input node of the XOR gate being electrically connected to the second output node of the last flip-flop, the output node of the XOR gate being electrically connected to the clock input nodes of the odd flip-flops in the flip-flop chain; and an inverter having an input node and an output node for inverting a signal inputted at the input node of the inverter, the input node of the inverter being electrically connected to the output node of the XOR gate, the output node of the inverter being electrically connected to the clock input nodes of the even flip-flops in the flip-flop chain; whereby a frequency of a signal outputted at the first output node of the last flip-flop is equal to the frequency of the clock signal divided by the divisor.

By utilizing a flip-flop chain having a plurality of general-purpose flip-flops and a simple combination of logic gates, namely an XOR gate plus an inverter, the present invention frequency divider can generate a signal of a frequency equal to a frequency of an input signal divided by the number of flip-flops. The present invention frequency divider uses only general-purpose flip-flops instead of the phase switching D flip-flops in the prior art, such that circuit designs of the LO path can be simplified, thus lowering the cost of manufacture.

These and other objectives of the claimed invention will no doubt become obvious to those of ordinary skill in the art after reading the following detailed description of the preferred embodiment that is illustrated in the various figures and drawings.

DETAILED DESCRIPTION

Figure 1:
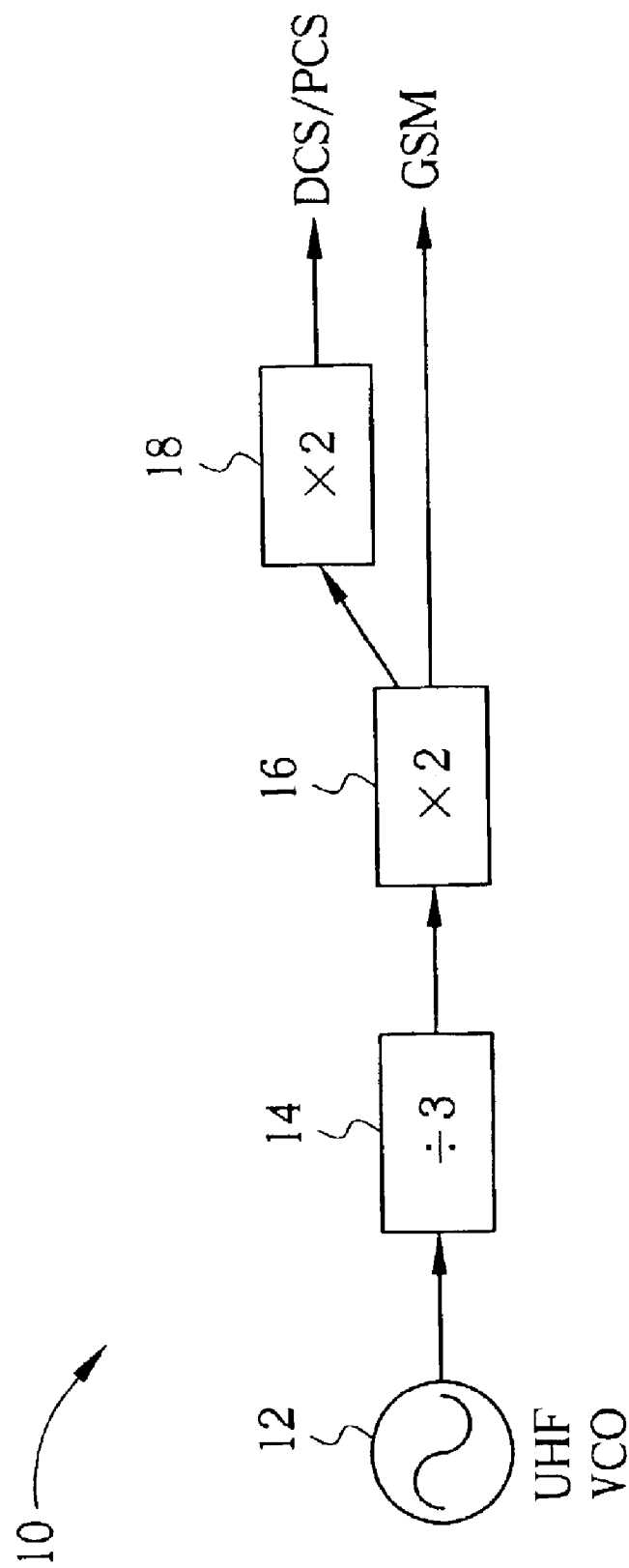
FIG. 1 is a block diagram of an LO path using a UHF VCO with $f_c$=1350 MHz according to the prior art.
Figure 2:
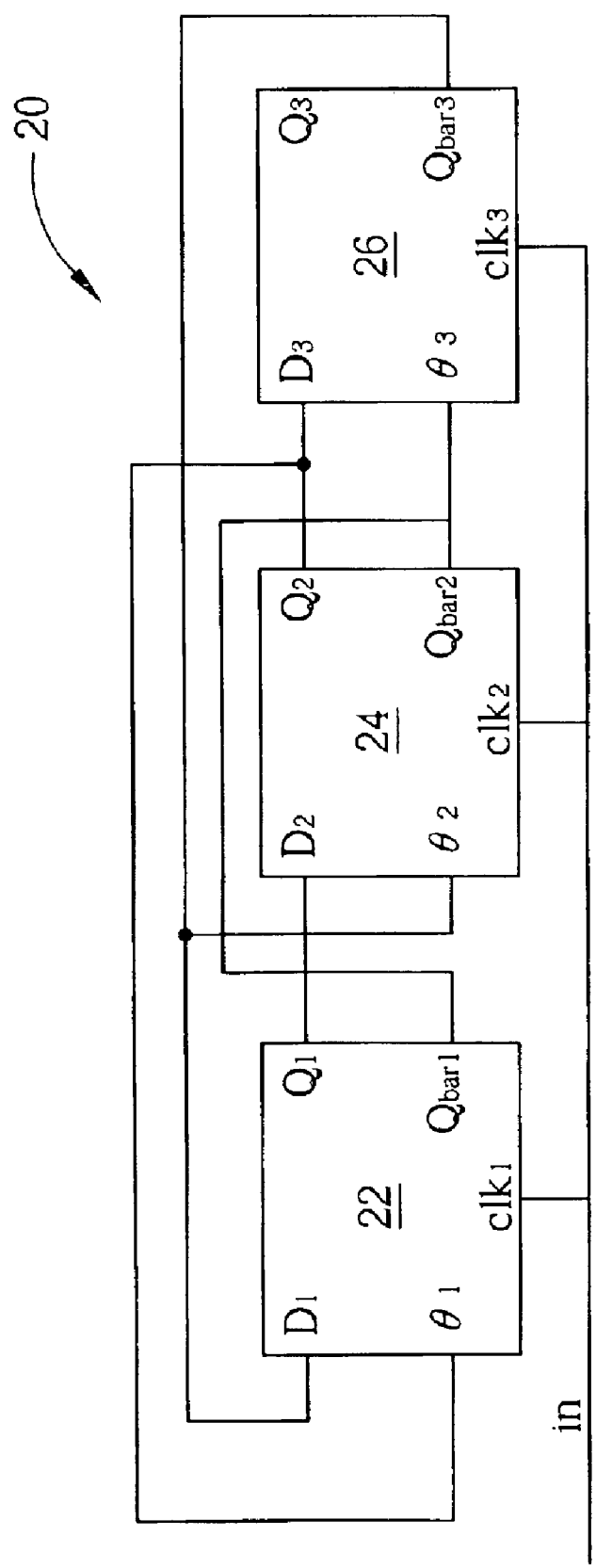
FIG. 2 is a block diagram of a divide-by-3 frequency divider in FIG. 1 according to prior art.
Figure 3:
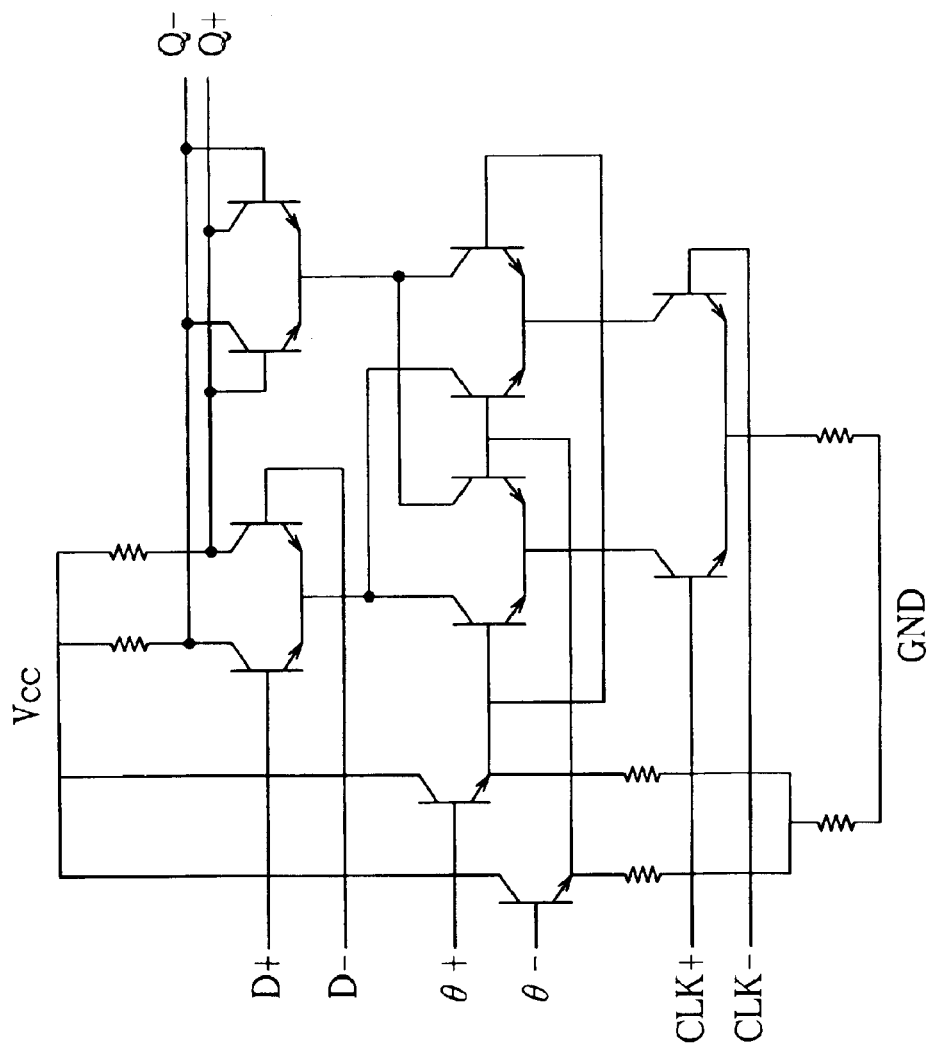
FIG. 3 is a circuit diagram of a phase switchable D flip-flop according to prior art.
Figure 4:
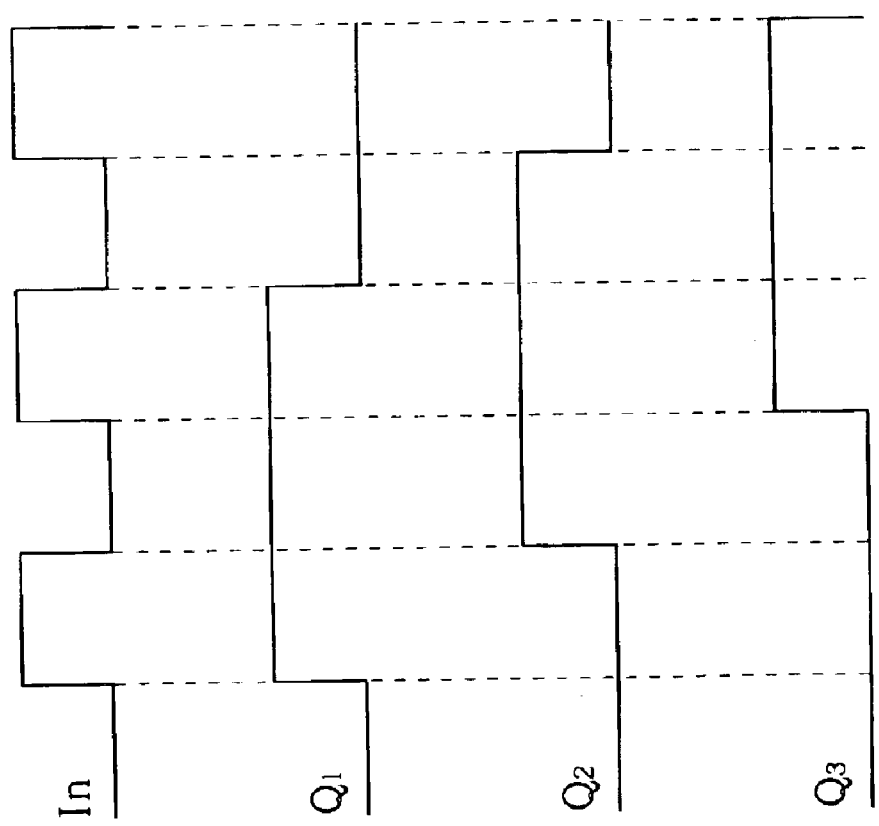
FIG. 4 is a time sequence of signals at nodes shown in FIG. 2.
Figure 5:
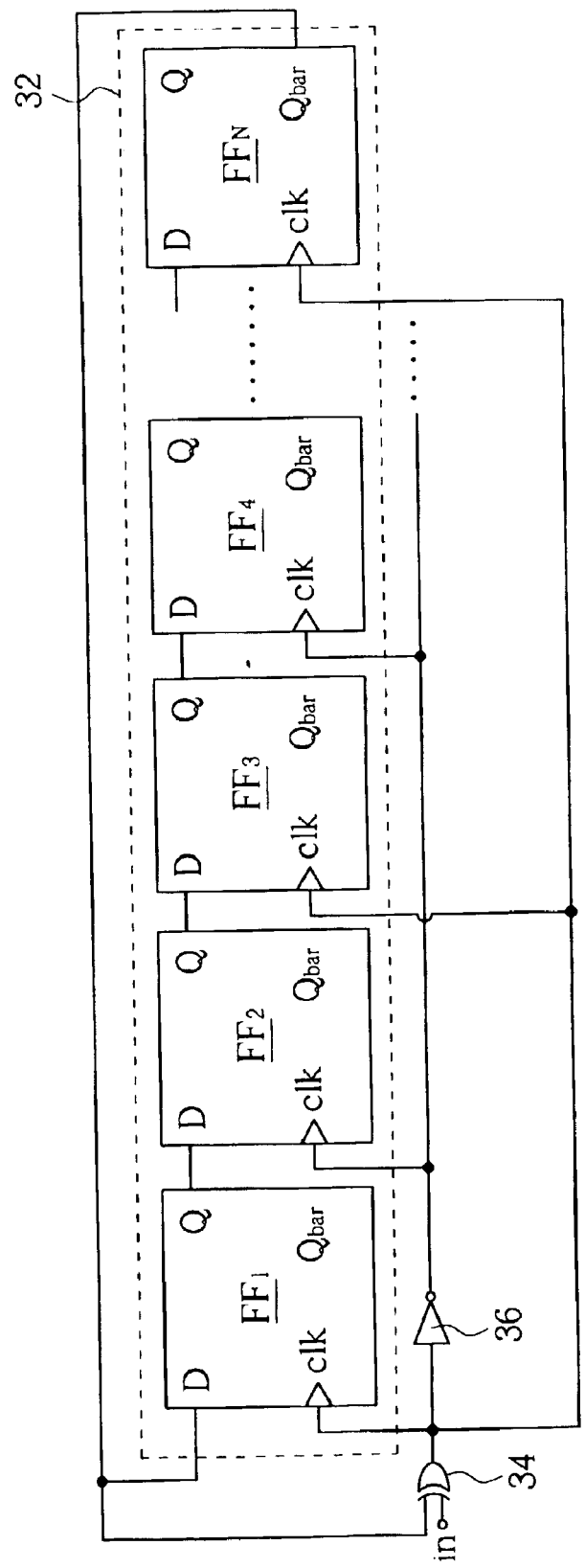
FIG. 5 is a block diagram of a divide-by-N frequency divider according to present invention.

Please refer to FIG. 5. FIG. 5 shows a block diagram of a divide-by-N frequency divider 30 according to present invention. The frequency divider 30 is used for dividing a frequency of an inputted clock signal in by a divisor. Here, the divisor is an odd number N. The frequency divider 30 comprises a flip-flop chain 32 having a plurality of flip-flops $FF_1$~$FF_N$ for latching signals. The number of flip-flops is equal to the divisor N. Each flip-flop has a data input node D, a clock input node clk, a first output node Q, and a second output node Qbar for outputting a logic signal complementary to a logic signal outputted at the first output node Q. The first output node Q of each but the last flip-flop $FF_N$ (i.e., each of the flip-flops $FF_1$~$FF_{N-1}$) is electrically connected to the data input node D of the next flip-flop. The second output node Qbar of the last flip-flop $FF_N$ is electrically connected to the data input node D of the first flip-flop $FF_1$.

The present invention frequency divider 30 also comprises an XOR gate 34 having two input nodes and an output node. One input node of the XOR gate 34 is electrically connected to the clock signal in, while the other input node of the XOR gate 34 is electrically connected to the second output node Qbar of the last flip-flop FFN. The output node of the XOR gate 34 is electrically connected to the clock input nodes clk of the odd flip-flops (i.e., $FF_1$, $FF_3$, $FF_5$ ... $FF_N$) in the flip-flop chain 32. The present invention frequency divider 30 further comprises an inverter 36 having an input node and an output node for inverting a signal inputted at the input node of the inverter 36. The input node of the inverter 36 is electrically connected to the output node of the XOR gate 34, while the output node of the inverter 36 is electrically connected to the clock input nodes clk of the even flip-flops (i.e., $FF_2$, $FF_4$, $FF_6$ ... $FF_{N-1}$) in the flip-flop chain 32.

Under the configuration of the above-mentioned frequency divider 30, a frequency of a signal outputted at the first output node Q of the last flip-flop $FF_N$ is equal to the frequency of the clock signal in divided by the divisor N. As a matter of fact, signals at the first output nodes Q of the flip-flops $FF_1$~$FF_N$ are of frequencies one-Nth a frequency of the clock signal in at the clock input nodes clk, wherein the signal at the first output node Q of one flip-flop leads the signal at the first output node Q of a next flip-flop by a phase difference.

Please note here, the flip-flops used in the present invention frequency divider 30 are general-purpose flip-flops, wherein the logic signal outputted at the first output node Q of a flip-flop traces the logic signal inputted at the data input node D of the flip-flop latched by the flip-flop during a previous clock cycle. The flip-flops can be D flip-flops, however any other types of flip-flops that are capable of achieving the same purpose also fall into the scope of the present invention.

Figure 6:
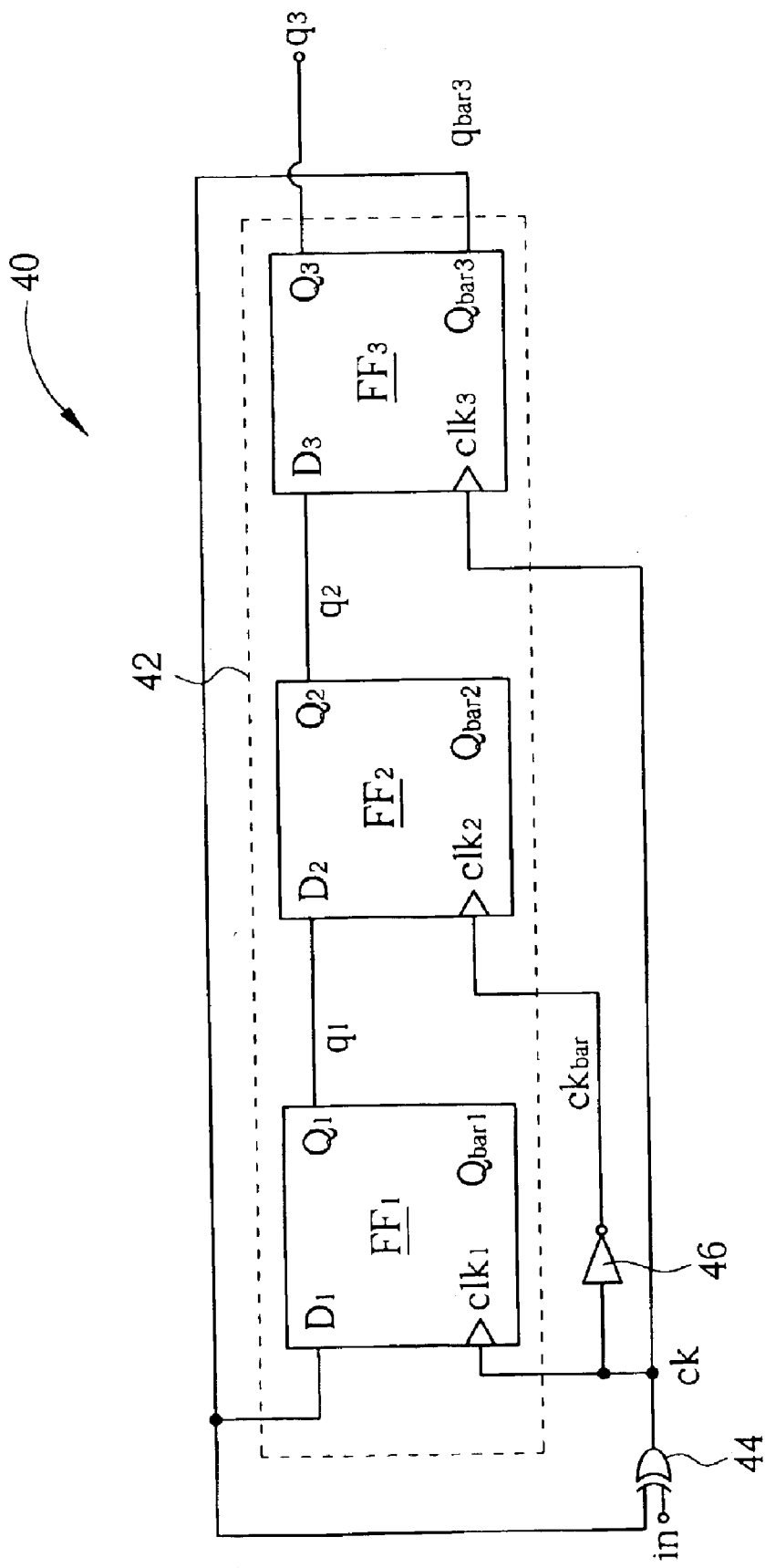
FIG. 6 is a block diagram of a divide-by-3 frequency divider according to present invention.

To describe the present invention frequency divider more specifically and in greater detail, now consider a preferred embodiment of the present invention with the divisor N being equal to 3. Please refer to FIG. 6. FIG. 6 shows a block diagram of a divide-by-3 frequency divider 40 according to the present invention. The frequency divider 40 for dividing a frequency of a clock signal in by 3 comprises a flip-flop chain 42 having a first flip-flop $FF_1$, a second flip-flop $FF_2$, and a third flip-flop $FF_3$ for latching signals. Each flip-flop has a data input node D, a clock input node clk, a first output node Q, and a second output node Qbar for outputting a logic signal complementary to a logic signal outputted at the first output node Q. A first output node Q1 of the first flip-flop $FF_1$ is electrically connected to a data input node D2 of the second flip-flop $FF_2$. A first output node Q2 of the second flip-flop $FF_2$ is electrically connected to a data input node D3 of the third flip-flop $FF_3$. A second output node Qbar3 of the third flip-flop $FF_3$ is electrically connected to a data input node D1 of the first flip-flop $FF_1$.

The present invention frequency divider 40 also comprises an XOR gate 44 having two input nodes and an output node. One input node of the XOR gate 44 is electrically connected to the clock signal in, while the other input node of the XOR gate 44 is electrically connected to the second output node Qbar3 of the third flip-flop $FF_3$. The output node of the XOR gate 44 is electrically connected to clock input nodes clk1, clk3 of the first and the third flip-flops $FF_1$, $FF_3$.

The present invention frequency divider 40 further comprises an inverter 46 having an input node and an output node for inverting a signal inputted at the input node of the inverter 46. The input node of the inverter 46 is electrically connected to the output node of the XOR gate 44, while the output node of the inverter 46 is electrically connected to a clock input node clk2 of the second flip-flop $FF_2$.

Figure 7:
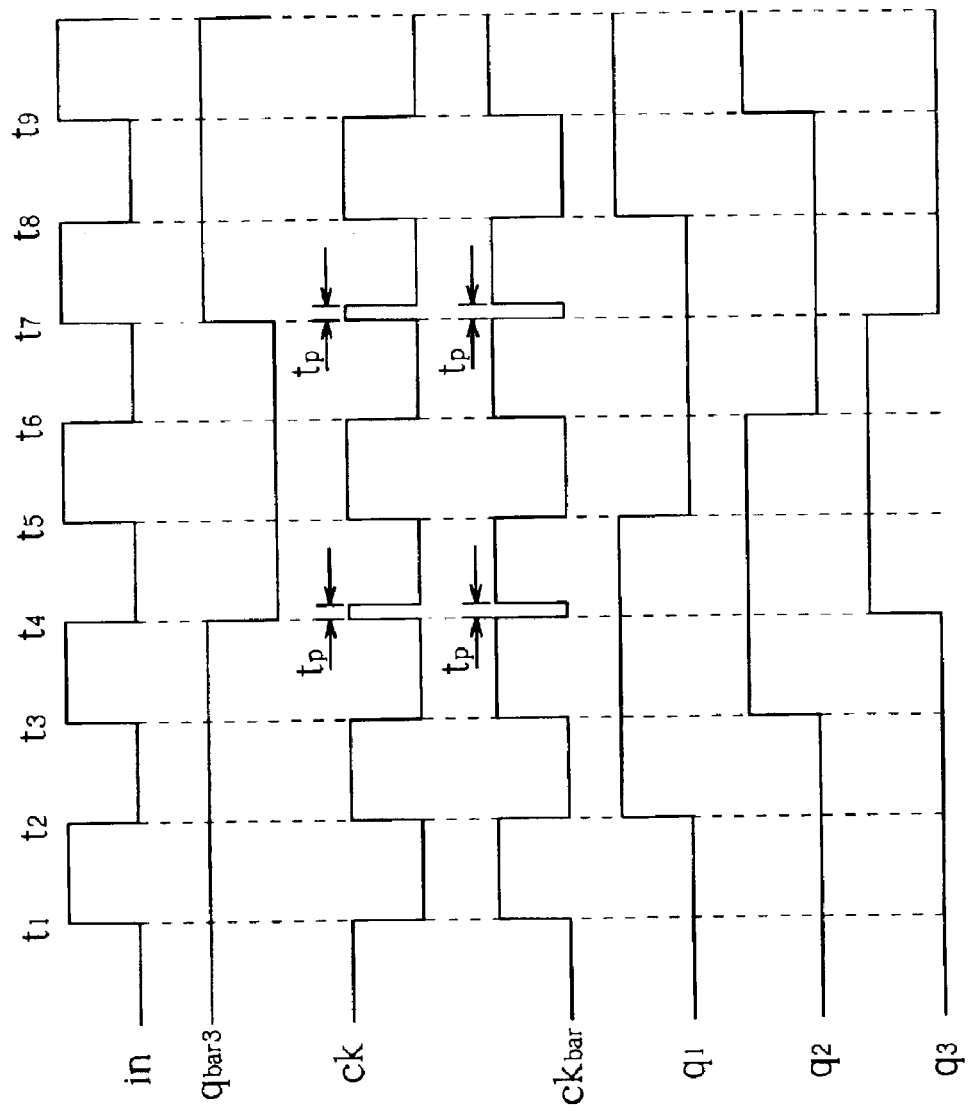
FIG. 7 is a time sequence of signals shown in FIG. 6.

Now please refer to FIG. 7. FIG. 7 shows a time sequence of signals shown in FIG. 6. In FIG. 7, the following signals shown in FIG. 6 are illustrated: in, qbar3, ck, ckbar, q1, q2, and q3, wherein in is the inputted clock signal, qbar3 is at the second output node Qbar3 of the third flip-flop $FF_3$ (i.e., D1), ck is the exclusive-OR operation result of the XOR gate 44 (i.e., clk1 and clk3), ckbar is a complementary signal of ck, q1 is at the first output node Q1 of the first flip-flop $FF_1$ (i.e., D2), q2 is at the first output node Q2 of the second flip-flop $FF_2$ (i.e., D3), and q3 is at the first output node Q3 of the third flip-flop $FF_3$ (i.e., a complementary signal of qbar3).

As shown in FIG. 7, suppose that before time $t_1$, the clock signal in has not been inputted to the XOR gate 44 and is set to logical "0", qbar3 is at a logical "1", and the clock signal in starts to flow into the XOR gate 44 at time $t_1$. At time $t_1$, the clock signal in switches from "0" to "1". As a result of the XOR operation on in and qbar3, ck switches from "1" to "0". At time $t_2$, the clock signal in switches from "1" back to "0", as a result ck switches from "0" to "1". At this time, because ck provides a rising edge at the clock input node clk1 of the first flip-flop $FF_1$ and the first flip-flop $FF_1$ latches a logical "1" from a previous clock cycle, q1 at the first output node Q1 of the first flip-flop $FF_1$ responds with a transition to a logical "1".

At time $t_3$, the clock signal in switches from "0" to "1", and as a result ck switches from "1" to "0", with ckbar changing from "0" to "1". At this time, because ckbar provides a rising edge at the clock input node clk2 of the second flip-flop $FF_2$ and the second flip-flop $FF_2$ latches a logical "1" from a previous clock cycle (i.e., a signal inputted at the data input node D2), q2 at the first output node Q2 of the second flip-flop $FF_2$ responds with a transition to a logical "1".

Similarly, at time $t_4$, the clock signal in switches from "1" to "0", and as a result ck switches from "0" to "1". At this time, because ck provides a rising edge at the clock input node clk3 of the third flip-flop $FF_3$ and the third flip-flop $FF_3$ latches a logical "1" from a previous clock cycle (i.e., a signal inputted at the data input node D3), q3 at the first output node Q3 of the third flip-flop $FF_3$ responds with a transition to a logical "1" and as a result, qbar3 responds with a transition from an original "1" to a "0". The transition of qbar3 causes a change in the result of the XOR operation of the XOR gate 44, and therefore after a time delay tp from time $t_4$, ck switches again from "1," to "0" and ckbar from "0" to "1", as shown in FIG. 7.

At time $t_5$, the clock signal in switches from "0" to "1", and now ck switches from "0" to "1". At this time, because ck provides a rising edge at the clock input node clk1 of the first flip-flop $FF_1$ and the first flip-flop $FF_1$ latches a logical "0" from a previous clock cycle (i.e., a signal inputted at the data input node D1), q1 at the first output node Q1 of the first flip-flop $FF_1$ responds with a transition from a logical "1" to "0".

At time $t_6$, the clock signal in switches from "1" to "0", and as a result ck switches from "1" to "0", with ckbar changing from "0" to "1". At this time, because ckbar provides a rising edge at the clock input node clk2 of the second flip-flop $FF_2$ and the second flip-flop $FF_2$ latches a logical "0" from a previous clock cycle (i.e., a signal inputted at the data input node D2), q2 at the first output node Q2 of the second flip-flop $FF_2$ responds with a transition from a logical "1" to "0".

Similarly, at time $t_7$, the clock signal in switches from "0" to "1", and as a result ck switches from "0" to "1". At this time, because ck provides a rising edge at the clock input node clk3 of the third flip-flop $FF_3$ and the third flip-flop $FF_3$ latches a logical "0" from a previous clock cycle (i.e., a signal inputted at the data input node D3), q3 at the first output node Q3 of the third flip-flop $FF_3$ responds with a transition from a logical "1" to "0", and as a result, qbar3 responds with a transition from na original "0" to a "1". The transition of qbar3 again causes a change in the result of the XOR operation of the XOR gate 44, and therefore after a time delay tp from time $t_7$, ck switches again from "1" to "0" and ckbar from "0" to "1", as shown in FIG. 7. After this, the whole cycle repeats itself continuously.

Under the configuration of the above-mentioned frequency divider 40, a frequency of a signal outputted at the first output node Q3 of the third flip-flop $FF_3$ is equal to the frequency of the clock signal in divided by 3. As a matter of fact, signals at the first output nodes Q1, Q2 of the flip-flops $FF_1$, $FF_2$ are also of frequencies one-third a frequency of the clock signal in, wherein the signal at the first output node of one flip-flop leads the signal at the first output node of a next flip-flop by a 60° phase difference.

Figure 8:
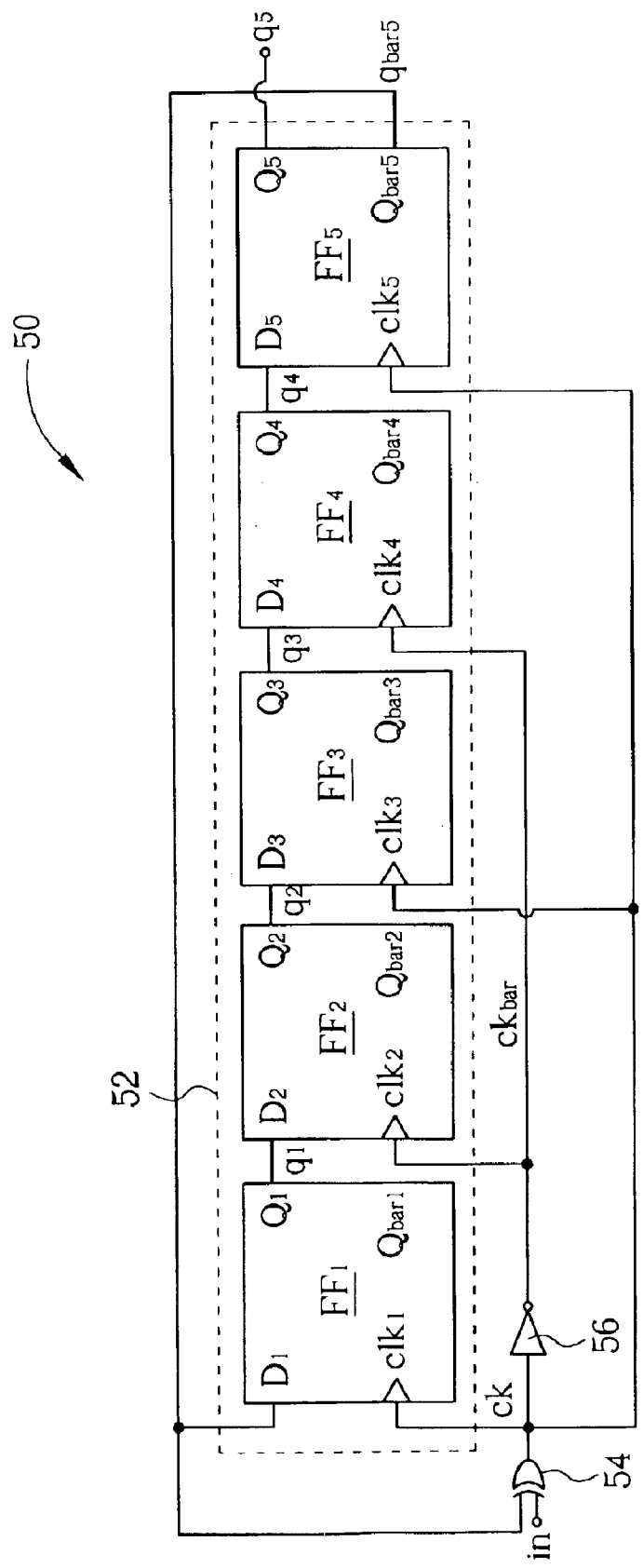
FIG. 8 is a block diagram of a divide-by-5 frequency divider according to present invention.

Consider another preferred embodiment of the present invention with the divisor N being equal to 5. Please refer to FIG. 8. FIG. 8 shows a block diagram of a divide-by-5 frequency divider 50 according to the present invention. The frequency divider 50 for dividing a frequency of a clock signal by 5 comprises a flip-flop chain 52 having a first flip-flop $FF_1$, a second flip-flop $FF_2$, a third flip-flop $FF_3$, a fourth flip-flop $FF_4$, and a fifth flip-flop $FF_5$ for latching signals. Each flip-flop has a data input node D, a clock input node clk, a first output node Q, and a second output node Qbar for outputting a logic signal complementary to a logic signal outputted at the first output node Q. A first output node Q1 of the first flip-flop $FF_1$ is electrically connected to a data input node D2 of the second flip-flop $FF_2$. A first output node Q2 of the second flip-flop $FF_2$ is electrically connected to a data input node D3 of the third flip-flop $FF_3$. A first output node Q3 of the third flip-flop $FF_3$ is electrically connected to a data input node D4 of the fourth flip-flop $FF_4$. A first output node Q4 of the fourth flip-flop $FF_4$ is electrically connected to a data input node D5 of the fifth flip-flop $FF_5$. A second output node Qbar5 of the fifth flip-flop $FF_5$ is electrically connected to the data input node D1 of the first flip-flop $FF_1$.

The present invention frequency divider 50 also comprises an XOR gate 54 having two input nodes and an output node. One input node of the XOR gate 54 is electrically connected to the clock signal in, while the other input node of the XOR gate 54 is electrically connected to the second output node Qbar5 of the fifth flip-flop $FF_5$. The output node of the XOR gate 54 is electrically connected to clock input nodes clk1, clk3, clk5 of the first, the third, and the fifth flip-flops $FF_1$, $FF_3$, $FF_5$. The present invention frequency divider 50 further comprises an inverter 56 having an input node and an output node for inverting a signal inputted at the input node of the inverter 56. The input node of the inverter 56 is electrically connected to the output node of the XOR gate 54, while the output node of the inverter 56 is electrically connected to clock input nodes clk2, clk4 of the second and the fourth flip-flops $FF_2$, $FF_4$.

Figure 9:
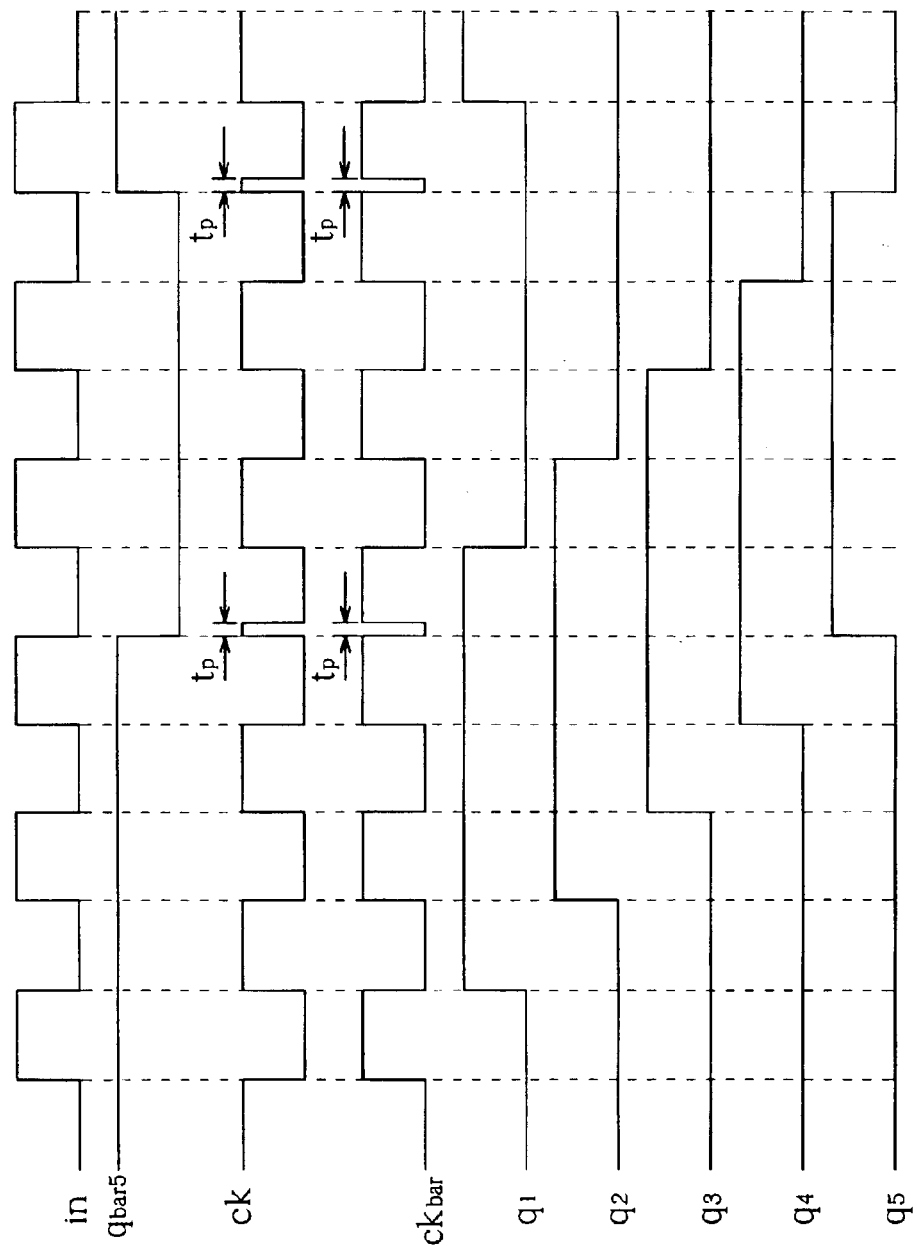
FIG. 9 is a time sequence of signals shown in FIG. 8.

Now please refer to FIG. 9. FIG. 9 shows a time sequence of signals shown in FIG. 8. In FIG. 9, the following signals shown in FIG. 8 are given: in, qbar5, ck, ckbar, q1, q2, q3, q4, and q5, wherein in is the inputted clock signal, qbar3 is at the second output node Qbar3 of the third flip-flop $FF_3$ (i.e., D1), ck is the exclusive-OR operation result of the XOR gate 44 (i.e., clk1 and clk3), ckbar is a complementary signal of ck, q1 is at the first output node Q1 of the first flip-flop $FF_1$ (i.e., D2), q2 is at the first output node Q2 of the second flip-flop $FF_2$ (i.e., D3), q3 is at the first output node Q3 of the third flip-flop $FF_3$ (i.e., D4), q4 is at the first output node Q4 of the fourth flip-flop $FF_4$ (i.e., D5), and q5 is at the first output node Q5 of the fifth flip-flop $FF_5$ (i.e., a complementary signal of qbar5).

According to FIG. 9 and an analysis similar to that previously done with FIG. 7, under the configuration of the above-mentioned frequency divider 50, a frequency of a signal outputted at the first output node Q5 of the fifth flip-flop $FF_5$ is equal to the frequency of the clock signal in divided by 5. As a matter of fact, signals at the first output nodes Q1, Q2, Q3, Q4 of the flip-flops $FF_1$, $FF_2$, $FF_3$, $FF_4$ are all of frequencies one-fifth a frequency of the clock signal in, wherein the signal at the first output node of one flip-flop leads the signal at the first output node of a next flip-flop by a 36° phase difference.

In contrast to the prior art, the present invention frequency divider requires merely a flip-flop chain having a plurality of general-purpose flip-flops and a simple combination of logic gates, namely an XOR gate plus an inverter, in order to generate a signal of a frequency equal to a frequency of an input signal divided by the number of flip-flops. The present invention frequency divider uses only general-purpose flip-flops instead of the phase switching D flip-flops in the prior art, such that circuit designs of the LO path can be simplified, thus to lowering the costs of manufacture.

Those skilled in the art will readily observe that numerous modifications and alterations of the device may be made while retaining the teachings of the invention. Accordingly, that above disclosure should be construed as limited only by the metes and bounds of the appended claims.

What is claimed is:

1. A frequency divider for dividing a frequency of a clock signal by a divisor, the divisor being an odd number, the frequency divider comprising:

a flip-flop chain having a plurality of flip-flops for latching signals, an amount of flip-flops being equal to the divisor, each flip-flop having a data input node, a clock input node, a first output node, and a second output node for outputting a logic signal complementary to a logic signal outputted at the first output node, the first output node of each but the last flip-flop being electrically connected to the data input node of the next flip-flop, the second output node of the last flip-flop being electrically connected to the data input node of the first flip-flop;

an XOR gate having two input nodes and an output node, one input node of the XOR gate being electrically connected to the clock signal, the other input node of the XOR gate being electrically connected to the second output node of the last flip-flop, the output node of the XOR gate being electrically connected to the clock input nodes of the odd flip-flops in the flip-flop chain; and an inverter having an input node and an output node for inverting a signal inputted at the input node of the inverter, the input node of the inverter being electrically connected to the output node of the XOR gate, the output node of the inverter being electrically connected to the clock input nodes of the even flip-flops in the flip-flop chain;

whereby a frequency of a signal outputted at the first output node of the last flip-flop is equal to the frequency of the clock signal divided by the divisor.

2. The frequency divider of claim 1 wherein the flip-flops are D flip-flops.

3. The frequency divider of claim 1 wherein a state of a logic signal outputted at the first output node of a flip-flop during a given clock cycle follows a state of a logic signal inputted at the data input node of the flip-flop latched by the flip-flop during an immediately preceding clock cycle.

4. The frequency divider of claim 1 wherein the divisor is equal to 3, the flip-flop chain having a first, a second, and a third flip-flop, the first output node of the first flip-flop being electrically connected to the data input node of the second flip-flop, the first output node of the second flip-flop being electrically connected to the data input node of the third flip-flop, the second output node of the third flip-flop being electrically connected to the data input node of the first flip-flop, the output node of the XOR gate being electrically connected to the clock input nodes of the first and the third flip-flops, the output node of the inverter being electrically connected to the clock input node of the second flip-flop.

5. The frequency divider of claim 1 wherein the divisor is equal to 5, the flip-flop chain having a first, a second, a third, a fourth, and a fifth flip-flop, the first output node of the first flip-flop being electrically connected to the data input node of the second flip-flop, the first output node of the second flip-flop being electrically connected to the data input node of the third flip-flop, the first output node of the third flip-flop being electrically connected to the data input node of the fourth flip-flop, the first output node of the fourth flip-flop being electrically connected to the data input node of the fifth flip-flop, the second output node of the fifth flip-flop being electrically connected to the data input node of the first flip-flop, the output node of the XOR gate being electrically connected to the clock input nodes of the first, the third, and the fifth flip-flops, the output node of the inverter being electrically connected to the clock input nodes of the second and the fourth flip-flops.

6. A frequency divider for dividing a frequency of a clock signal by 3, the frequency divider comprising:

a flip-flop chain having a first, a second, and a third flip-flop for latching signals, each flip-flop having a data input node, a clock input node, a first output node, and a second output node for outputting a logic signal complementary to a logic signal outputted at the first output node, the first output node of the first flip-flop being electrically connected to the data input node of the second flip-flop, the first output node of the second flip-flop being electrically connected to the data input node of the third flip-flop, the second output node of the third flip-flop being electrically connected to the data input node of the first flip-flop;

an XOR gate having two input nodes and an output node, one input node of the XOR gate being electrically connected to the clock signal, the other input node of the XOR gate being electrically connected to the second output node of the third flip-flop, the output node of the XOR gate being electrically connected to the clock input nodes of the first and the third flip-flops; and an inverter having an input node and an output node for inverting a signal inputted at the input node of the inverter, the input node of the inverter being electrically connected to the output node of the XOR gate, the output node of the inverter being electrically connected to the clock input node of the second flip-flop;

whereby a frequency of a signal outputted at the first output node of the third flip-flop is equal to the frequency of the clock signal divided by 3.

7. The frequency divider of claim 6 wherein the flip-flops are D flip-flops.

8. The frequency divider of claim 6 wherein a state of a logic signal outputted at the first output node of a flip-flop during a given clock cycle follows a state of a logic signal inputted at the data input node of the flip-flop latched by the flip-flop during an immediately preceding clock cycle.

9. A frequency divider for dividing a frequency of a clock signal by 5, the frequency divider comprising:

a flip-flop chain having a first, a second, a third, a fourth, and a fifth flip-flop for latching signals, each flip-flop having a data input node, a clock input node, a first output node, and a second output node for outputting a logic signal complementary to a logic signal outputted at the first output node, the first output node of the first flip-flop being electrically connected to the data input node of the second flip-flop, the first output node of the second flip-flop being electrically connected to the data input node of the third flip-flop, the first output node of the third flip-flop being electrically connected to the data input node of the fourth flip-flop, the first output node of the fourth flip-flop being electrically connected to the data input node of the fifth flip-flop, the second output node of the fifth flip-flop being electrically connected to the data input node of the first flip-flop;

an XOR gate having two input nodes and an output node, one input node of the XOR gate being electrically connected to the clock signal, the other input node of the XOR gate being electrically connected to the second output node of the fifth flip-flop, the output node of the XOR gate being electrically connected to the clock input nodes of the first, the third, and the fifth flip-flops; and an inverter having an input node and an output node for inverting a signal inputted at the input node of the inverter, the input node of the inverter being electrically connected to the output node of the XOR gate, the output node of the inverter being electrically connected to the clock input nodes of the second and the fourth flip-flops;

whereby a frequency of a signal outputted at the first output node of the third flip-flop is equal to the frequency of the clock signal divided by 5.

10. The frequency divider of claim 9 wherein the flip-flops are D flip-flops.

11. The frequency divider of claim 9 wherein a state of a logic signal outputted at the first output node of a flip-flop during a given clock cycle follows a state of a logic signal inputted at the data input node of the flip-flop latched by the flip-flop during an immediately preceding clock cycle.

12. A frequency divider for dividing a frequency of a clock signal by a divisor N, the frequency divider comprising:

N flip-flops for latching signals, each of the N flip-flops having a data input node, a clock input node, a first output node, and a second output node for outputting a logic signal complementary to a logic signal outputted at the first output node, the first output node of each but a last flip-flop being electrically connected to the data input node of a next flip-flop, the second output node of the last flip-flop being electrically connected to the data input node of the first flip-flop;

an XOR gate having two input nodes and an output node, a first input node of the XOR gate being electrically connected to the clock signal, a second input node of the XOR gate being electrically connected to the second output node of the last flip-flop, the output node of the XOR gate being electrically connected to the clock input nodes of odd flip-flops; and an inverter having an input node and an output node for inverting a signal inputted at the input node of the inverter, the input node of the inverter being electrically connected to the output node of the XOR gate, the output node of the inverter being electrically connected to the clock input nodes of the even flip-flops in the flip-flop chain;

whereby a frequency of a signal outputted at the first output node of the last flip-flop is equal to the frequency of the clock signal divided by the divisor N.

13. The frequency divider of claim 12 the divisor N being an odd number.

14. The frequency divider of claim 12 wherein states of logic signals outputted at the first output nodes of the flip-flops during a given clock cycle follow states of logic signals inputted at the data input nodes of the flip-flops latched by the flip-flops during an immediately preceding clock cycle.

15. The frequency divider of claim 14 wherein the flip-flops are D flip-flops.

16. The frequency divider of claim 12 wherein the divisor N is equal to 3.

17. The frequency divider of claim 12 wherein the divisor N is equal to 5.

* * * * *